(12) United States Patent
Eshel et al.

(10) Patent No.: US 9,715,941 B2
(45) Date of Patent: Jul. 25, 2017

(54) STATE MACHINE CONTROLLED MOS LINEAR RESISTOR

(71) Applicant: Sony Semiconductor Solutions Corporation, Kanagawa (JP)

(72) Inventors: Noam Eshel, Pardesia (IL); Amit Sokolover, Tokyo (JP); Golan Zeituni, Kfar-Saba (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/928,507

(22) Filed: Oct. 30, 2015

(65) Prior Publication Data

US 2017/0125123 A1 May 4, 2017

(51) Int. Cl.
*G11C 27/02* (2006.01)
*H03K 17/687* (2006.01)

(52) U.S. Cl.
CPC .......... *G11C 27/02* (2013.01); *H03K 17/687* (2013.01)

(58) Field of Classification Search
CPC ...... G11C 27/02; G11C 27/024; G11C 27/026
USPC .............................................. 327/91, 94, 95
See application file for complete search history.

(56) References Cited

U.S. PATENT DOCUMENTS

| | | | | |
|---|---|---|---|---|
| 5,783,952 A | * | 7/1998 | Kazazian | G11C 27/028 327/91 |
| 7,843,442 B2 | * | 11/2010 | Choi | G09G 3/3233 327/94 |
| 2004/0263057 A1 | * | 12/2004 | Uchino | G09G 3/3233 313/500 |
| 2004/0263501 A1 | * | 12/2004 | Yamashita | G09G 3/3233 345/204 |

* cited by examiner

*Primary Examiner* — William Hernandez
(74) *Attorney, Agent, or Firm* — Michael Best & Friedrich LLP (57) ABSTRACT

A sample-and-hold circuit includes a sampling capacitor, a first transistor, a first switch between a gate electrode and a source electrode of the first transistor, a current source connected to the source electrode of the first transistor, and a resistive element and a second switch connected in parallel between a drain electrode of the first transistor and a predetermined voltage. The resistive element may include a second transistor biased to operate in a linear region according to a gate control signal at a gate electrode of the second transistor, or may include multiple transistor banks connected in parallel, each including a second transistor biased to operate in a linear region according to a gate control signal at a gate electrode of the second transistor. The gate control signal may originate from a circuit including a state machine.

15 Claims, 9 Drawing Sheets

|        | Transistor 813 | Transistor 823 | Transistor 833 |
|--------|----------------|----------------|----------------|
| 0      | 0              | 0              | 0              |
| 1 / RST| 1              | 0              | 0              |
| 2      | 0              | 1              | 0              |
| 3      | 1              | 1              | 0              |
| 4      | 0              | 0              | 1              |
| 5      | 1              | 0              | 1              |
| 6      | 0              | 1              | 1              |
| 7      | 1              | 1              | 1              |

FIG. 11

STATE MACHINE CONTROLLED MOS LINEAR RESISTOR

BACKGROUND OF THE INVENTION

1. Field of the Invention

This application relates generally to sample-and-hold circuits. More specifically, this application relates to a sample-and-hold circuit that utilizes a transistor as a resistive element.

2. Description of Related Art

Image sensing devices typically consist of an image sensor, generally an array of pixel circuits, as well as signal processing circuitry and any associated control or timing circuitry. Within the image sensor itself, charge is collected in a photoelectric conversion device of the pixel circuit as a result of the impingement of light.

Figure 1:
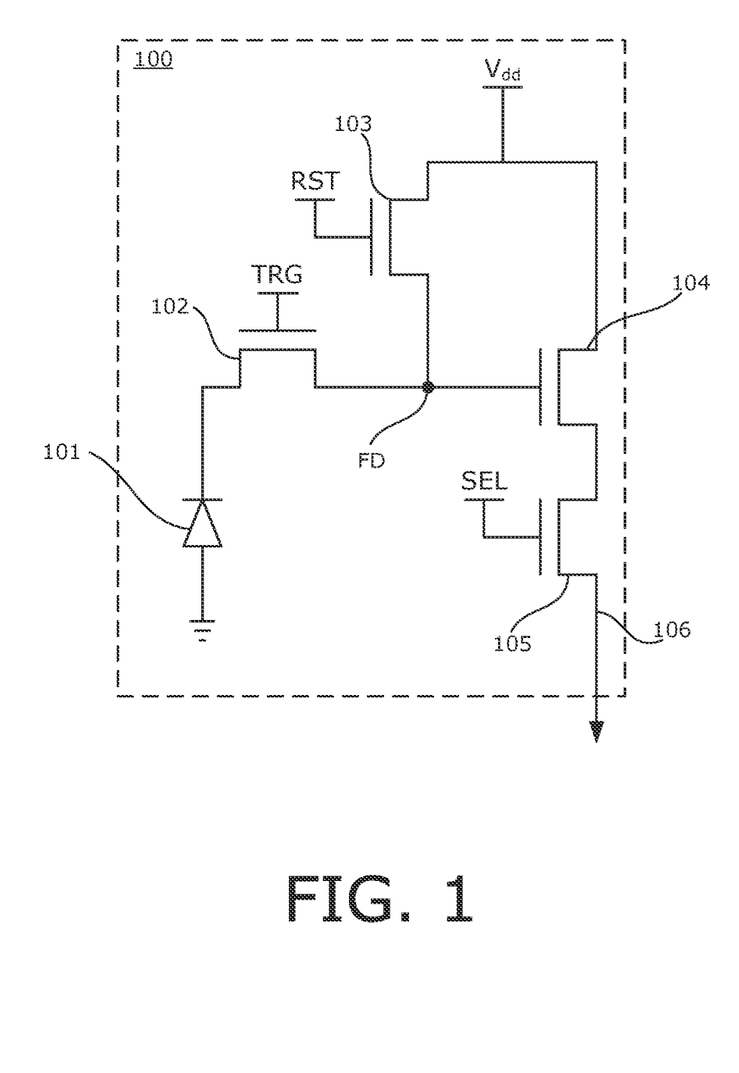
FIG. 1 illustrates an exemplary pixel circuit for use with various aspects of the present disclosure.

One example of a pixel circuit is illustrated in FIG. 1. As shown in FIG. 1, a pixel circuit 100 includes a photoelectric conversion device 101 (for example, a photodiode), a floating diffusion FD, a transfer transistor 102, a reset transistor 103, an amplification transistor 104, and a selection transistor 105, and a vertical signal line 106. As illustrated, vertical signal line 106 is common to a plurality of pixel circuits within the same column. Alternatively, a vertical signal line may be shared among multiple columns. Gate electrodes of transfer transistor 102, reset transistor 103, and selection transistor 105 receive signals TRG, RST, and SEL, respectively. These signals may, for example, be provided by the control or timing circuitry.

While FIG. 1 illustrates a pixel circuit having four transistors in a particular configuration, the current disclosure is not so limited and may apply to a pixel circuit having fewer or more transistors as well as other elements, such as capacitors, resistors, and the like. Additionally, the current disclosure may be extended to configurations where one or more transistors are shared among multiple photoelectric conversion devices.

The accumulated charge is then converted to a digital value. Such a conversion typically requires several circuit components such as sample-and-hold (S/H) circuits, analog-to-digital converters (ADC), and timing and control circuits, with each circuit component serving a purpose in the conversion. For example, the purpose of the S/H circuit may be to sample the analog signals from different time phases of the photo diode operation, after which the analog signals may be converted to digital form by the ADC.

However, in sample-and-hold circuit implementations it may be desirable to adjust various circuit components to, for example, increase the accuracy of a comparison in a correlated double sampling (CDS) operation. Thus, there exists a need for a sample-and-hold circuit that is tuned for high accuracy.

BRIEF SUMMARY OF THE INVENTION

Various aspects of the present disclosure relate to a sample-and-hold circuit and/or a gate control circuit for improving the operation of a sample-and-hold circuit.

In one aspect of the present disclosure, a sample-and-hold circuit includes a sampling capacitor, a first transistor, a first switch between a gate electrode and a source electrode of the first transistor, a current source connected to the source electrode of the first transistor, and a resistive element and a second switch connected in parallel between a drain electrode of the first transistor and a predetermined voltage, wherein the resistive element includes a second transistor biased to operate in a linear region according to a gate control signal at a gate electrode of the second transistor.

In another aspect of the present disclosure, a sample-and-hold circuit includes a sampling capacitor, a first transistor, a first switch between a gate electrode and a source electrode of the first transistor, a current source connected to the source electrode of the first transistor, and a resistive element and a second switch connected in parallel between a drain electrode of the first transistor and a predetermined voltage, wherein the resistive element includes multiple transistor banks connected in parallel, each including a second transistor biased to operate in a linear region according to a gate control signal at a gate electrode of the second transistor. The gate control signal may originate from a circuit including a state machine.

In yet another aspect of the present disclosure, a transistor gate control circuit is configured to supply a gate control signal to a transistor circuit including at least one first transistor, comprising a current source; and a plurality of transistor banks, respective ones of the plurality of transistor banks including a second transistor, a gate electrode of the respective second transistor being connected to a gate electrode of the first transistor circuit.

In the above aspects of the present disclosure, at least one state change signal may be generated by a state machine for controlling the connection or disconnection of various transistors within the circuits.

In this manner, the above aspects of the present disclosure provide for improvements in at least the technical field of signal processing, as well as the related technical field of imaging.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the S/H circuits are used in image sensors, it will be understood that this is merely one example of an implementation. It will further be understood that the disclosed S/H circuits can be used in any device in which there is a need to sample a signal and/or compare two voltages; for example, an audio signal processing circuit, industrial measurement and control circuit, and so on.

In this manner, the present disclosure provides for improvements in the technical field of signal processing, as well as in the related technical fields of image sensing and image processing.

[Sample-and-Hold Circuit]

Figure 2:
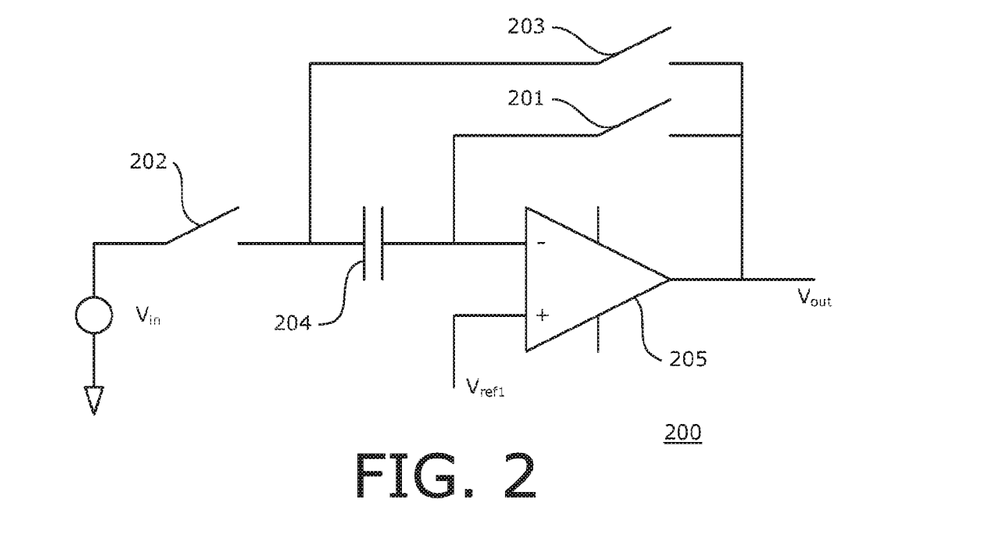
FIG. 2 illustrates an exemplary bottom plate sampling S/H circuit according to various aspects of the present disclosure.

FIG. 2 illustrates an exemplary analog S/H circuit 200, of a bottom plate sampling type. This illustrative S/H circuit comprises an amplifier 205, a sampling capacitor 204, and switches 201-203. In this example, $V_{ref1}$ is a reference voltage and $V_{in}$ is the input analog voltage (that is, the input signal) to be sampled. In an image sensor implementation, $V_{in}$ represents a pixel value. Switches 201-203 are preferably transistors, such as CMOS transistors.

Figure 3:
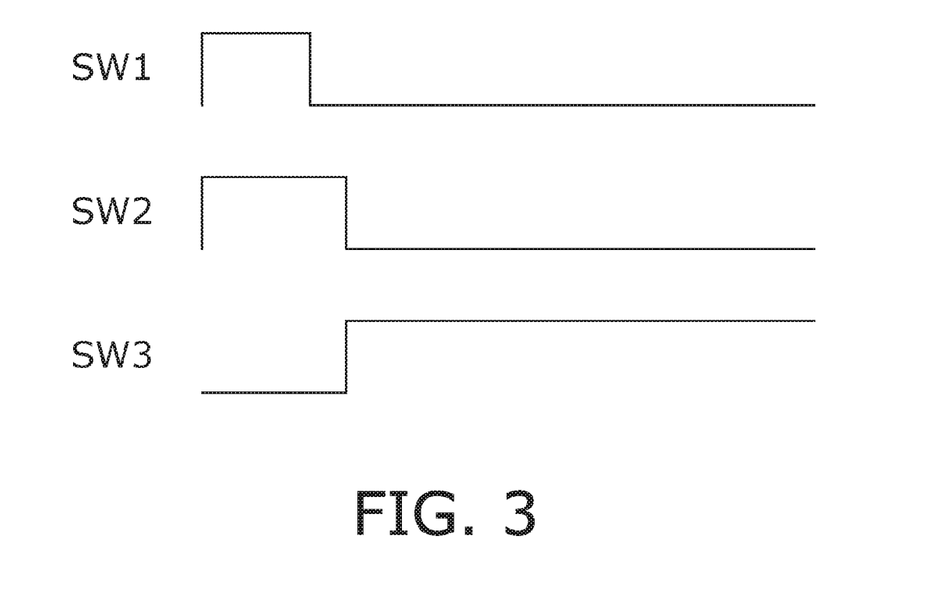
FIG. 3 illustrates an exemplary signal timing diagram of the exemplary S/H circuit according to FIG. 2.

In operation, switches 201-203 are controlled according to a particular timing by control signals SW1-SW3. That is, switch 201 is controlled by a control signal SW1, switch 202 is controlled by a control signal SW2, and switch 203 is controlled by a control signal SW3. FIG. 3 illustrates an exemplary timing diagram for the operation of S/H circuit 200, and shows the respective waveforms of control signals SW1-SW3. In FIG. 3, for purposes of illustration, "high" signals indicate "closed" (i.e., connected) switches and "low" signals indicate "open" (i.e., disconnected) switches.

At the beginning of the illustrated period, the signal $V_{in}$ is sampled. During this period, signals SW1 and SW2 are high and signal SW3 is low. Thus, switches 201 and 202 are closed, whereas switch 203 is open. This causes capacitor 204 to be charged to the voltage $V_c = V_{in}(t1) - V_{ref1}$, where t1 is the time where the capacitor is charged. After capacitor 204 has been charged, signal SW1 becomes low, while signal SW2 remains high and signal SW3 remains low. Thus, switch 201 is opened, while switch 202 remains closed and switch 203 remains open. This disconnects the feedback path of amplifier 205. The voltage at capacitor 204 remains at the level of the previous stage, i.e. $V_{in}(t1) - V_{ref1}$. Then, signals SW2 and SW3 are reversed. That is, while switch 201 remains open, switch 202 becomes open and switch 203 becomes closed. The voltage $V_c$ on capacitor 204 and the feedback connection on amplifier 205 cause the output voltage $V_{out}$ of amplifier 205 to be the same as $V_{in}$. That is, $V_{out} = V_c + V_{ref1} = V_{in}(t1) - V_{ref1} + V_{ref1} = V_{in}(t1)$.

Figure 4:
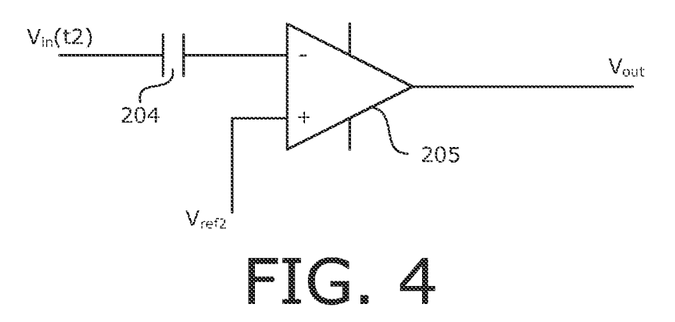
FIG. 4 illustrates an exemplary S/H circuit at a particular timing of the signal timing diagram according to FIG. 3.

In addition to this sampling operation, specific applications may require a comparison between the output of the pixel circuit and a particular threshold. This comparison may be performed after the second step but before the third step in the sampling operation described above; that is, when both switches 201 and 203 are open and switch 202 is closed. FIG. 4 illustrates the state of S/H circuit 200 at this time, where the reference voltage is denoted $V_{ref2}$. At this time, amplifier 205 acts as a comparator. Because capacitor 204 is charged to $V_c = V_{in}(t1) - V_{ref1}$, the differential voltage at the input of amplifier 205 is $V_{ref2} - V_{in}(t2) + V_{in}(t1) - V_{ref1}$. Therefore, if $V_{in}(t2) > V_{in}(t1) + V_{ref2} - V_{ref1}$, the comparator output is at a high state. Conversely, if $V_{in}(t2) < V_{in}(t1) + V_{ref2} - V_{ref1}$, the comparator output is at a low state.

Figure 5A:
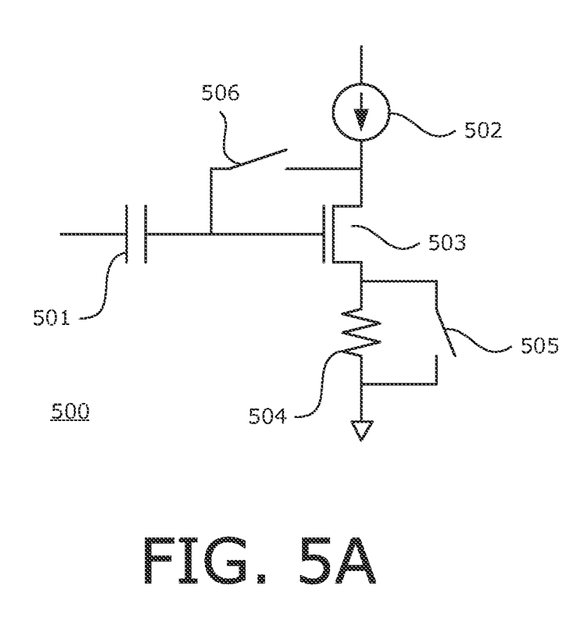
FIGS. 5A-C illustrate an exemplary digital comparator according to various aspects of the present disclosure.

To incorporate the comparison operation in an image sensor for particular purposes such as black sun detection, analog gain control, and the like, it is preferable to be able to change $V_{ref1}$ and $V_{ref2}$. FIGS. 5A-C illustrate an exemplary switched capacitor circuit 500 for the purposes of shifting a detection threshold in a S/H circuit such as S/H circuit 200. Switched capacitor circuit 500 includes a sampling capacitor 501, a current source 502 that outputs a current I, a transistor 503, a resistor 504 having a resistance R, and switches 505 and 506. One electrode of sampling capacitor 501 is connected to a gate electrode of transistor 503. Current source 502 is connected to a first current terminal (e.g., a source electrode) of transistor 503. Switch 506 is provided between the gate and the first current terminal of transistor 503. Resistor 504 and switch 505 are provided, in parallel, between a second current terminal (e.g., a drain electrode) of transistor 503 and a predetermined voltage, such as ground.

Figure 5B:
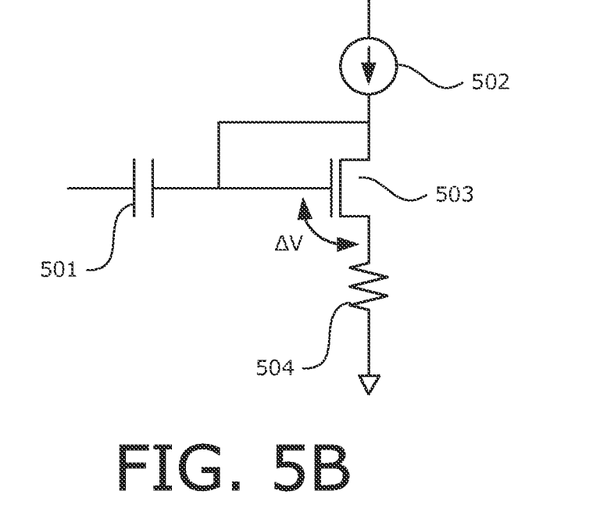
Figure 5C:
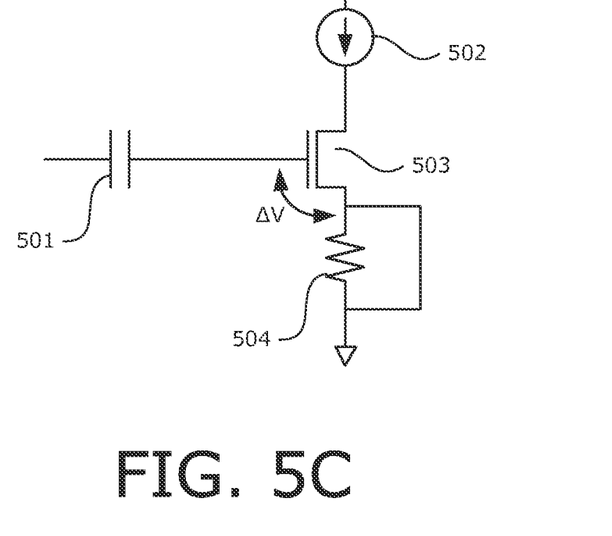

During operation of the sampling phase, switch 505 is open and switch 506 is closed, as illustrated in FIG. 5B. At this time t1, sampling capacitor 501 is charged to a voltage of $V_{in}(t1) - (I \times R + \Delta V)$ where $\Delta V$ is the gate-drain voltage of transistor 503. Subsequently, switch 505 is closed and switch 506 is opened, as illustrated in FIG. 5C. If, at this time t2, $V_{in}(t2) > V_{in}(t1) - I \times R$, transistor 503 is on and the transistor output point is at a low level. If, however, $V_{in}(t2) < V_{in}(t1) - I \times R$, transistor 503 is off and the transistor output point is at a high level. As a result, the "trip point" of this exemplary circuit is $V_{in}(t1) - I \times R$.

The product $I \times R$ determines the shift in the trip point and thus the precision of both I and R determine the accuracy of the comparison.

[Trip Point Control]

Figure 6:
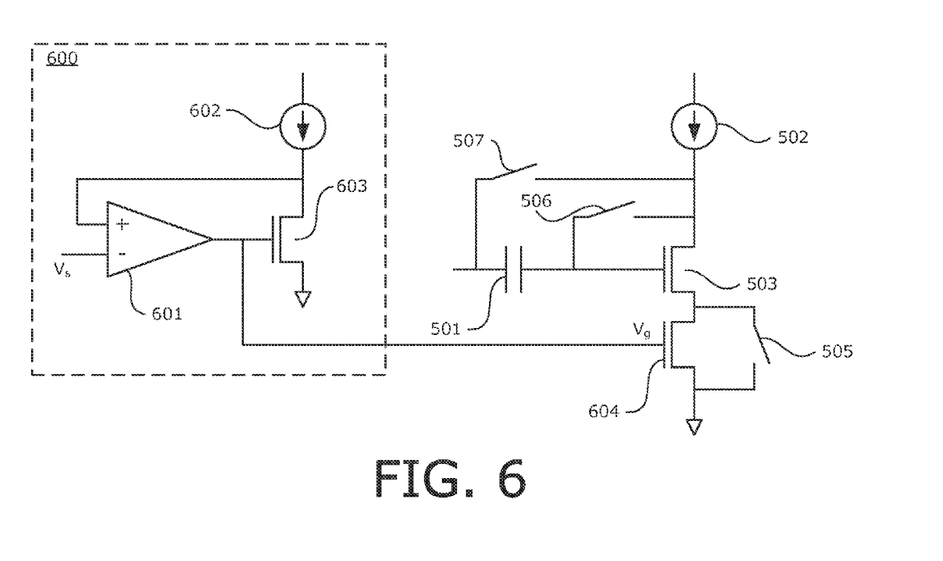
FIG. 6 illustrates an exemplary S/H circuit and controller circuit according to various aspects of the present disclosure.

FIG. 6 illustrates an exemplary S/H circuit where the resistor of FIG. 5A has been replaced with a transistor 604. Switches 506 and 507 are also illustrated and operate similar to those described above with regard to FIG. 2. Additionally, a gate control circuit 600 is provided to control the gate voltage $V_g$ of transistor 604. Gate control circuit 600 includes an amplifier 601, a current source 602, and a transistor 603. To provide effective gate control, current sources 502 and 602 are matched such that the current output of both is I, and transistors 603 and 604 are matched such that they have the same characteristics.

Figure 7:
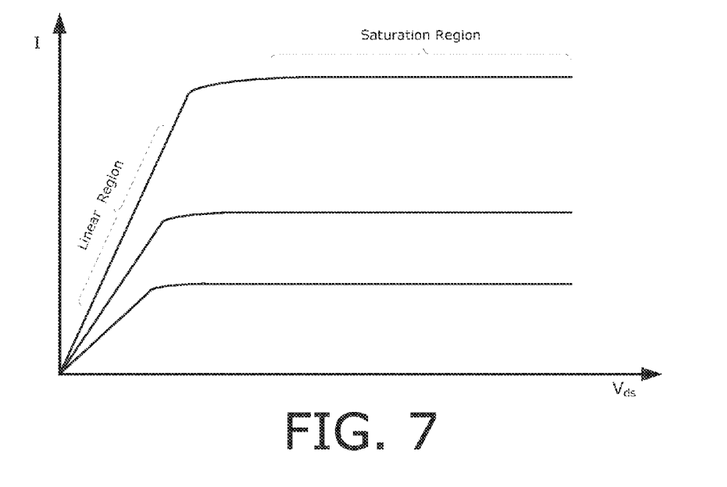
FIG. 7 illustrates an exemplary current-voltage curve according to various aspects of the present disclosure.

FIG. 7 illustrates an exemplary current-voltage plot for transistors illustrating the operating modes thereof. In FIG. 7, the vertical axis represents the current I and the horizontal axis represents the drain-source voltage $V_{ds}$ across a transistor. The different curves in FIG. 7 are parameterized by the gate voltage $V_g$. For each specific curve (that is, for each $V_g$ value), I is approximately linearly proportional to $V_{ds}$ when $V_{ds}$ is low. Thus, this region is referred to as the linear or ohmic region. In this region, the transistor behaves like a resistor with a resistance equal to $V_{ds}/I$. For larger values of $V_{ds}$, the I versus $V_{ds}$ curve begins to bend and the relationship is no longer linear. This region is referred to as the saturation region. Here, transistor 604 is biased to operate in the linear mode.

In operation, for example for black sun detection or analog gain control, it is desirable to provide a shift in the comparator trip point as required by the particular operation. As noted above, this trip point is specified by $V_{in}(t1)-I\times R$. Thus, it is preferable to provide an appropriate resistance value R corresponding to the required trip point for the particular application.

In the illustration of FIG. 6, transistor 604 is controlled so as to operate as a resistor with resistance R. This operation is equivalent to choosing a value $V_g$ such that the operating curve illustrated in FIG. 7 has a gradient in the linear region equal to 1/R. Thus, as gate control circuit 600 provides $V_g$ to transistor 604, the resistance value R can be dynamically controlled, thus providing a circuit that is more flexible to adapt to various applications.

Because, as noted above, transistors 603 and 604 are matched and current sources 502 and 602 are matched, the respective drain-source voltages of transistors 603 and 604 are the same. Therefore, the desired operating voltage $V_g$ can be achieved by applying an appropriate control voltage $V_s$ at the negative input of amplifier 601. Because transistor 604 is required to operate in the linear region, there are two conditions that $V_g$ must satisfy. First, to ensure that $V_g$ is not clipped during operation, $V_g$ should be less than the power supply voltage $V_{dd}$ of amplifier 601. Second, to ensure linear operation, $V_g$ should be set such that $V_g > V_{th} + V_s$ where $V_{th}$ is a threshold voltage that may depend on I, on a width to length ratio of the transistor in a silicon substrate, temperature, and the like.

Thus, in a practical circuit implementation, it is preferable to control the transistor to operate at a target resistance value R while operating in the linear region without clipping. While FIG. 7 illustrates a particular operating range (a resistance range for R and an operating voltage range for $V_g$) for a single transistor, it is also possible to extend this range in order to ensure that it is possible to provide the required resistance value R while keeping $V_{ds}$ large enough that the transistor operates in the linear region, while at the same time maintaining $V_g$ that satisfies the conditions listed above. This may be accomplished by using multiple transistors in parallel and providing a mechanism to select the appropriate transistors depending on $V_{ds}$.

Figure 8:
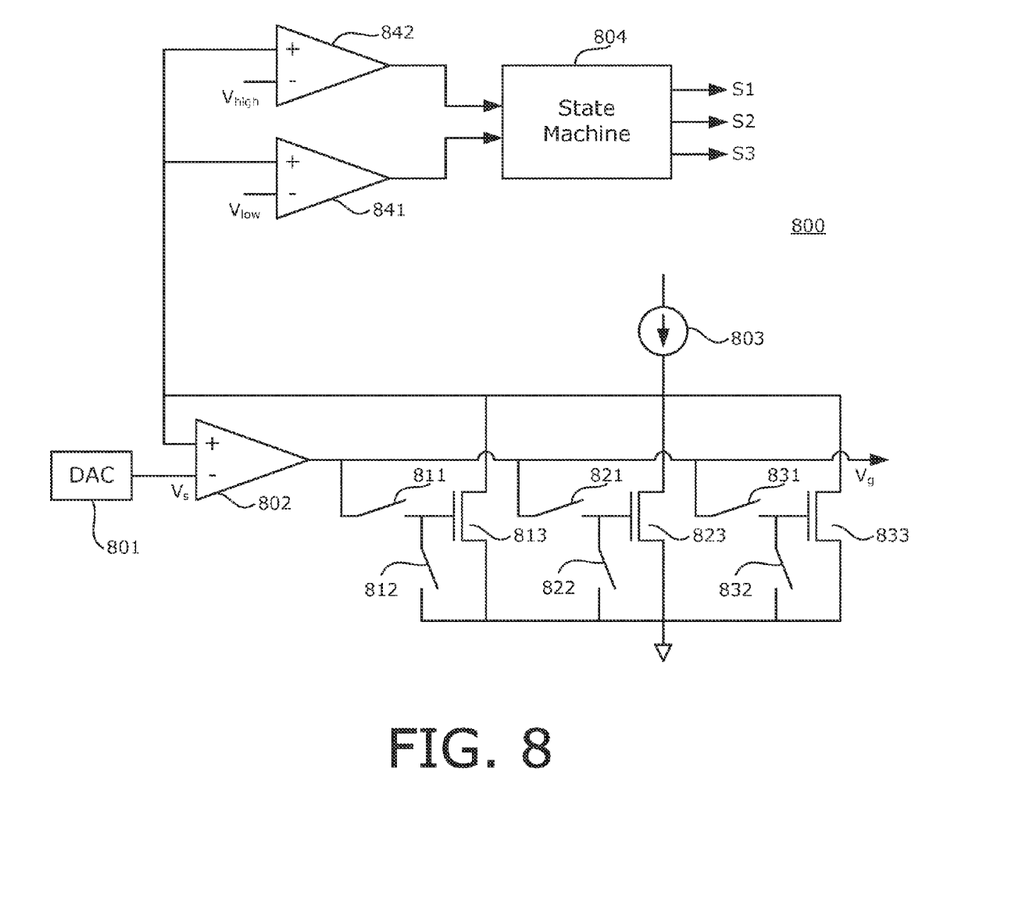
FIG. 8 illustrates another exemplary controller circuit according to various aspects of the present disclosure.

FIG. 8 illustrates an implementation utilizing multiple transistors to expand the operating range of a gate control circuit. Specifically, FIG. 8 illustrates a gate control circuit 800 that may, for example, replace gate control circuit 600 of FIG. 6. Gate control circuit 800 includes a digital-to-analog converter (DAC) 801; an amplifier 802; a current source 803 providing a current I; a state machine 804; switches 811-812, 821-822, and 831-832; transistors 813, 823, and 833; and comparators 841 and 842. The switches and transistors are grouped into three banks such that switches 811-812 and transistor 813 form a first bank; switches 821-822 and transistor 823 form a second bank; and switches 831-832 and transistor 833 form a third bank. The three banks are connected in parallel, and are respectively switched in and out of the circuit by control signals S1-S3 that are produced by state machine 804. Each of the transistors 813, 823, and 833 are designed with different characteristics (i.e., different shapes including different aspect ratios, and sizes in the silicon) so that they, either individually or operating in parallel, provide a large operating range for R and $V_g$.

In gate control circuit 800, the drain-source voltage $V_{ds}$ is fed to the positive input of comparators 841 and 842. A low switching voltage $V_{low}$ is fed to the negative input of comparator 841, and high switching voltage $V_{high}$ is fed to the negative input of comparator 842. The high and low switching voltages represent the two cutoff voltages that are used for determining states and switching the three transistors. To connect transistor 813, switch 811 is closed while switch 812 is open. To disconnect transistor 813, switch 811 is open while switch 812 is closed. Transistors 823 and 833 are connected or disconnected in a similar manner using switches 821-822 and 831-832, respectively. The voltage $V_g$ is provided to a transistor in the S/H circuit as described above. However, to maintain characteristic matching between transistors in gate control circuit 800 and the corresponding S/H circuit, it is preferable to utilize three transistors in the S/H circuit and selectively provide $V_g$ to one or more of the three transistors in a manner so as to mirror the selected transistors in gate control circuit 800. This is illustrated by FIG. 9.

Figure 9:
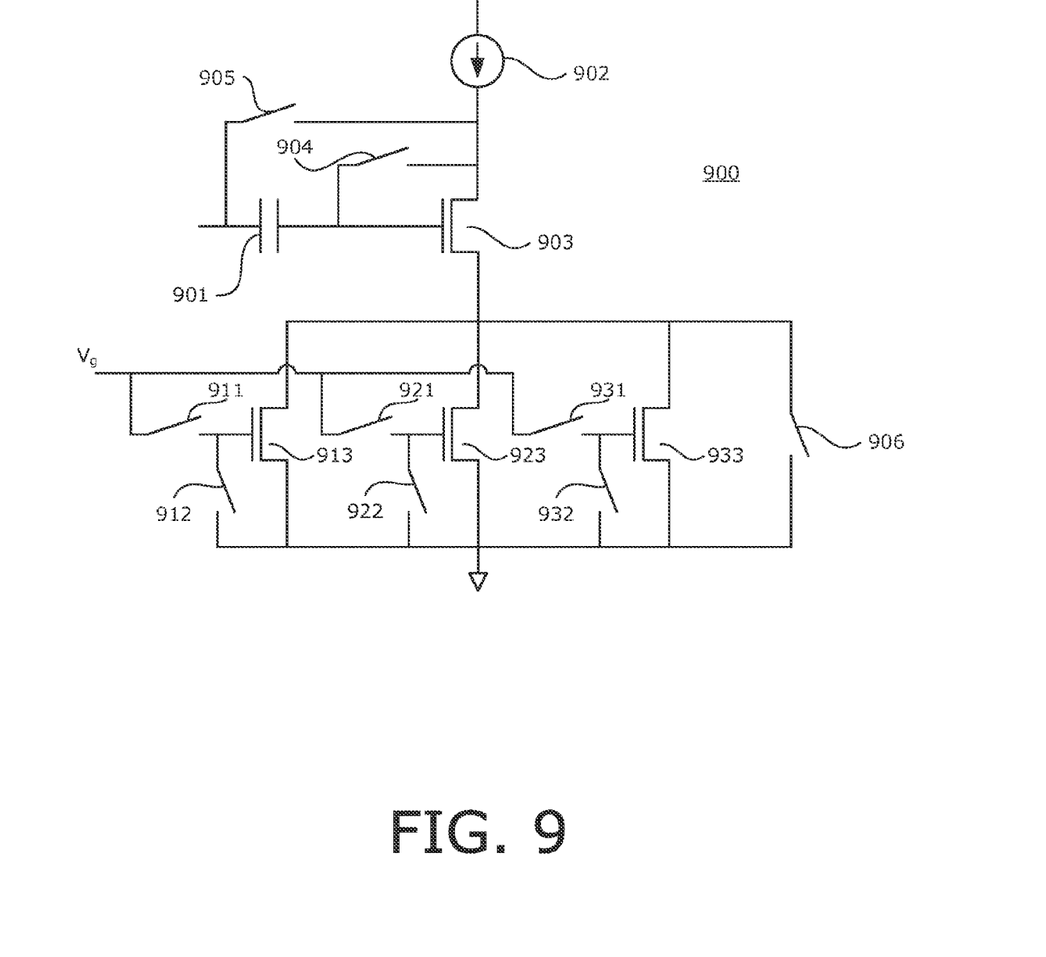
FIG. 9 illustrates another exemplary S/H circuit according to various aspects of the present disclosure.

FIG. 9 illustrates an exemplary S/H circuit 900 utilizing multiple transistors to expand the operating range in conjunction with gate control circuit 800. S/H circuit 900 includes a sampling capacitor 901, a current source 902, a transistor 903, and switches 904-906, similar to the illustration of FIG. 6. However, in S/H circuit 900, the transistor for trip point control has been replaced by a set of three banks of transistors and associated switches connected in parallel with switch 906. Specifically, switches 911-912 and transistor 913 form a first bank; switches 921-922 and transistor 923 form a second bank; and switches 931-932 and transistor 933 form a third bank. The three banks are respectively switched in and out of the circuit by control signals S1-S3 that are produced by state machine 804 in a manner that mirrors the switches in gate control circuit 800. To connect transistor 913, switch 911 is closed while switch 912 is open. To disconnect transistor 913, switch 911 is open while switch 912 is closed. Transistors 923 and 933 are connected or disconnected in a similar manner using switches 921-922 and 931-932, respectively. The voltage $V_g$ is provided from gate control circuit 800. The transistors in S/H circuit 900 are matched to the corresponding transistors in gate control circuit 800 such that transistors 813 and 913 are matched, 823 and 923 are matched, and 833 and 933 are matched.

While FIGS. 8-9 show three transistors in parallel for purposes of illustration, it is straightforward to utilize only two transistors or more than three transistors using a similar logic and layout. When using three transistors, it is possible to provide seven different states. More generally, when using n transistors, it is possible to provide $2^n-1$ states, as the state with all transistors disconnected is not used.

In FIG. 8, comparators 841 and 842 provide information to the state machine as to whether $V_{ds}$ is higher than $V_{high}$, between $V_{low}$ and $V_{high}$, or less than $V_{low}$. Using this information and the current states of transistors 813, 823, and 833 (which respectively correspond to the current states of 913, 923, and 933), the state machine determines whether the transistor configuration should be kept the same or changed. In the particular implementation of an image sensor, this determination is done once per row and the transistor configuration is updated once per row as needed. Other updating frequencies, either higher or lower, can be designed for this circuit.

Figure 10:
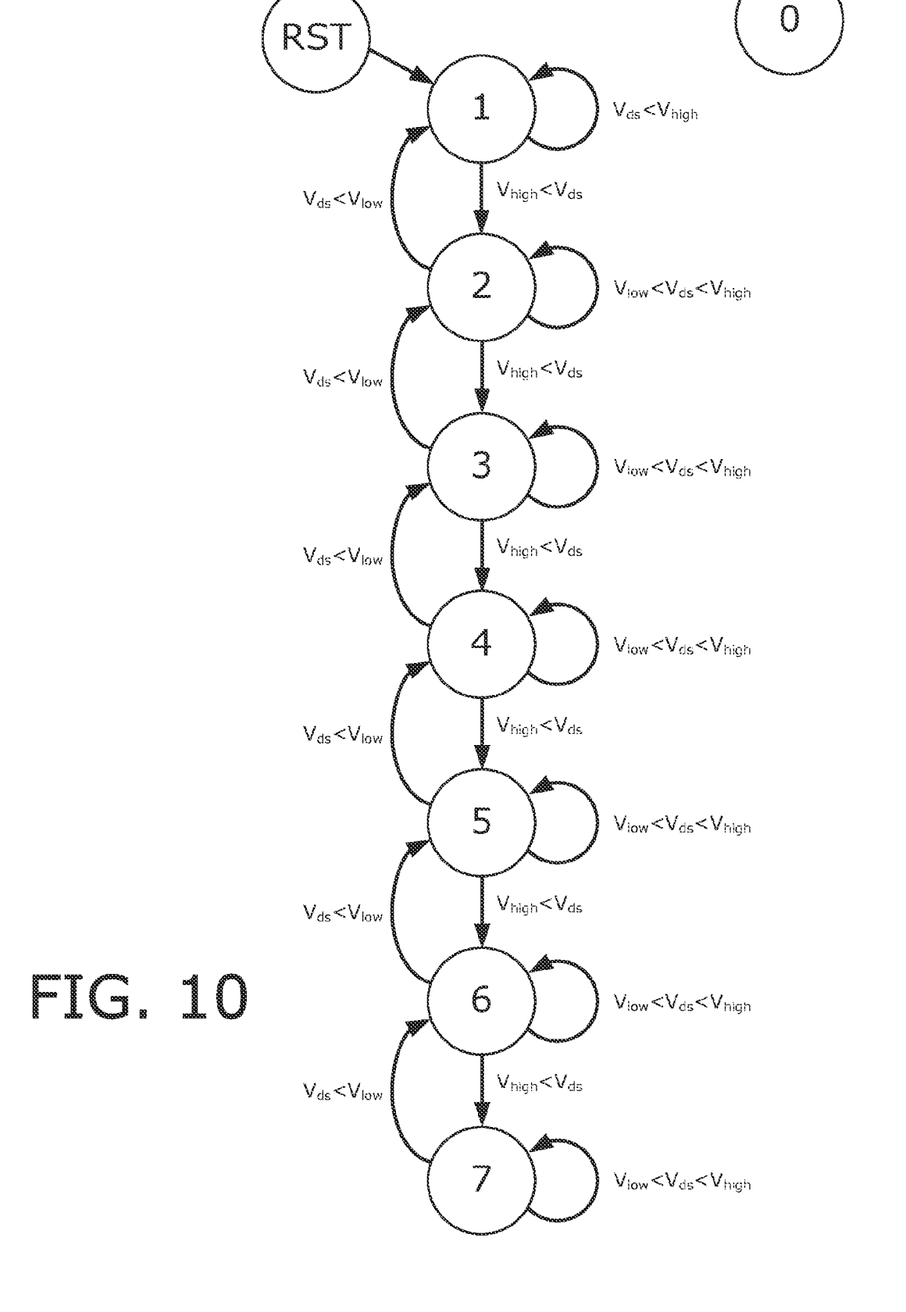
FIG. 10 illustrates a state diagram for the exemplary controller circuit according to FIG. 8.
Figure 11:
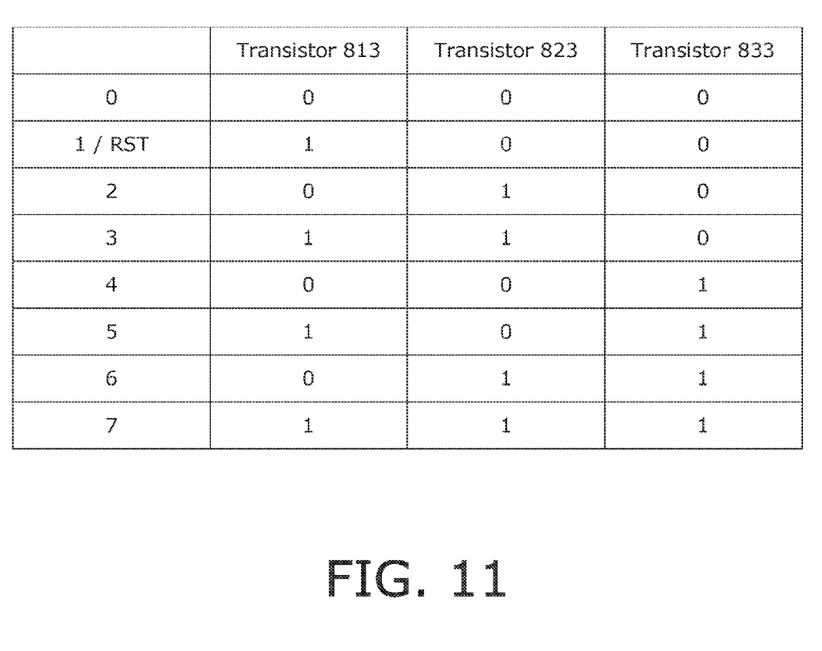
FIG. 11 illustrates an exemplary state table for the exemplary controller circuit according to FIG. 8.

FIG. 10 illustrates an exemplary state transition diagram for gate control circuit 800 and S/H circuit 900. Each circle represents a state that is identified by the number therein. FIG. 11 illustrates the transistor connection configuration for each state, where "1" indicates connected and "0" indicates disconnected. Thus, state 0 corresponds to a configuration where all transistors are disconnected and is not used. State 1 also corresponds to a "reset" state, which is the state at which the system initializes to after a system reset. This state is one where transistors 813 and 913 are connected while transistors 823, 833, 923, and 933 are disconnected.

As illustrated by FIG. 10, state machine 804 evaluates whether a transition should occur based on a relationship between $V_{low}$, $V_{high}$, and $V_{ds}$. For example, where the system is currently in state 2 (that is, transistors 823 and 923 are connected while transistors 813, 833, 913, and 933 are disconnected), state machine 804 compares $V_{ds}$ to $V_{low}$ and $V_{high}$ to determine whether a transition should occur and, if so, which transition. If $V_{low}<V_{ds}<V_{high}$, state 2 is maintained. If $V_{ds}>V_{high}$, the system transitions to state 3 (where transistors 813, 823, 913, and 923 are connected while transistors 833 and 933 are disconnected). If $V_{ds}<V_{low}$, the system transitions to state 1 (where transistors 813 and 913 are connected while transistors 823, 833, 923, and 933 are disconnected).

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A sample-and-hold circuit, comprising:
   a sampling capacitor;
   a first transistor;
   a first switch disposed between a gate and a source of the first transistor;
   a first current source connected to the source of the first transistor; and
   a resistive element and a second switch connected in parallel and disposed between a drain of the first transistor and a predetermined voltage,
   wherein the resistive element includes a second transistor biased to operate in a linear region according to a gate control signal at a gate of the second transistor.

2. The sample-and-hold circuit according to claim 1, further comprising a gate control circuit configured to supply the gate control signal to the second transistor.

3. The sample-and-hold circuit according to claim 2, wherein the gate control circuit includes a second current source and a third transistor, a gate of the third transistor being connected to the gate of the second transistor.

4. The sample-and-hold circuit according to claim 3, wherein
   the second transistor and the third transistor have matched transistor characteristics, and
   the first current source and the second current source are configured to produce the same current.

5. A sample-and-hold circuit, comprising:
   a sampling capacitor;
   a first transistor;
   a first switch disposed between a gate and a source of the first transistor;
   a first current source connected to the source of the first transistor; and
   a resistive element and a second switch connected in parallel and disposed between a drain of the first transistor and a predetermined voltage,
   wherein the resistive element includes a gate control circuit configured to provide a gate control signal.

6. The sample-and-hold circuit according to claim 5, wherein the gate control circuit includes a second current source and a plurality of control transistor banks connected in parallel, respective ones of the plurality of control transistor banks including a second transistor biased to operate in a linear region to provide the gate control signal.

7. The sample-and-hold circuit according to claim 6, wherein the resistive element includes at least one S/H transistor bank, a respective S/H transistor bank corresponding to a respective control transistor bank and including a third transistor, a gate of the respective third transistor being connected to the gate of the corresponding second transistor.

8. The sample-and-hold circuit according to claim 7, wherein the at least one S/H transistor bank is one S/H transistor bank, and the plurality of control transistor banks is three control transistor banks.

9. The sample-and-hold circuit according to claim 7, wherein the at least one S/H transistor bank is three S/H transistor banks, and the plurality of control transistor banks is three control transistor banks.

10. The sample-and-hold circuit according to claim 9, wherein respective third transistors have transistor characteristics different from one another.

11. The sample-and-hold circuit according to claim 7, wherein
a respective S/H transistor bank includes a first bank switch disposed between a gate of the corresponding third transistor and an output of the gate control circuit, and a second bank switch disposed between the gate and a source of the corresponding third transistor, and
the respective first and second bank switches are configured to selectively connect and disconnect the corresponding third transistor to the output of the gate control circuit according to at least one state signal received from the gate control circuit.

12. The sample-and-hold circuit according to claim 7, wherein
a respective second transistor and a corresponding third transistor have matched transistor characteristics, and
the first current source and the second current source are configured to produce the same current.

13. The sample-and-hold circuit according to claim 6, wherein
the gate control circuit includes a first comparator configured to compare a feedback voltage to a low switching voltage and output a first comparison result, a second comparator configured to compare the feedback voltage to a high switching voltage and output a second comparison result, and a state machine configured to receive the first and second comparison results and output at least one state signal,
respective ones of the plurality of second transistor banks include a first bank switch disposed between a gate of the corresponding second transistor and an output of the gate control circuit, and a second bank switch disposed between the gate and a source of the corresponding second transistor, and
the respective first and second bank switches are configured to selectively connect and disconnect the corresponding second transistor to the output of the gate control circuit according to the at least one state signal.

14. The sample-and-hold circuit according to claim 13, wherein the at least one state signal is configured to cause a first state change if the feedback voltage is lower than the low switching voltage, a second state change if the feedback voltage is higher than the high switching voltage, and no state change if the feedback voltage is between the low switching voltage and the high switching voltage.

15. The sample-and-hold circuit according to claim 6, wherein respective second transistors have transistor characteristics different from one another.

* * * * *